United States Patent
Gattuso et al.

(10) Patent No.: US 8,033,854 B1
(45) Date of Patent: Oct. 11, 2011

(54) IC SOCKET HAVING INDIVIDUAL LATCH HINGE

(75) Inventors: Andrew David Gattuso, Chandler, AZ (US); Hsiu-Yuan Hsu, Tu-Cheng (TW); Ke-Hao Chen, Tu-Cheng (TW); Chih-Kai Yang, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/775,468

(22) Filed: May 6, 2010

(51) Int. Cl.
*H01R 13/62* (2006.01)

(52) U.S. Cl. .......................................... 439/330; 439/73

(58) Field of Classification Search .................... 439/70, 439/71, 73, 330, 331, 342
See application file for complete search history.

(56) References Cited

U.S. PATENT DOCUMENTS

| | | | |
|---|---|---|---|
| 6,162,066 A * | 12/2000 | Glick et al. | 439/73 |
| 6,739,894 B2 * | 5/2004 | Ogura | 439/330 |
| 6,863,553 B2 * | 3/2005 | Watanabe | 439/330 |
| 6,984,142 B2 * | 1/2006 | Shimizu | 439/268 |
| 7,121,858 B2 | 10/2006 | Chen | |
| 7,666,016 B2 * | 2/2010 | Kobayashi | 439/296 |
| 7,722,376 B2 * | 5/2010 | Kobayashi | 439/331 |

\* cited by examiner

*Primary Examiner* — Thanh Tam Le
(74) *Attorney, Agent, or Firm* — Ming Chieh Chang; Wei Te Chung; Andrew C. Cheng

(57) ABSTRACT

An IC socket includes a driving member, a socket body mounted below the driving member and a latch member assembled to the base. The driving member is operated between an upper position and a lower position, and drives the latch member to shift between a closed position and an opened position. The base is assembled with a detachable latch hinge, to which the latch member is pivotally attached. The latch hinge can be easily replaced with another proper one according to a thickness of the IC package to the received in the IC socket.

14 Claims, 5 Drawing Sheets

IC SOCKET HAVING INDIVIDUAL LATCH HINGE

BACKGROUND OF THE INVENTION

1. Field of the Invention

The present invention relates to an IC (Integrated Circuit) socket, and more particularly to an IC socket having an individual latch hinge which can be easily replaced with another one so that the IC socket is adapted to receive various IC packages of different thicknesses therein for testing purpose.

2. Description of Related Art

U.S. Pat. No. 7,121,858 issued to Chen on Oct. 17, 2006 discloses a typical IC socket for interconnecting an IC package and a test board. The IC socket includes a base mounted on the test board, a number of contacts retained in the base, and a driving member mounted upon the base to drive a pair of latch members to press the IC package firmly within the socket. The driving member has a rectangular configuration and is manually or automatically operated from an upper position to a lower position. Correspondingly, the latch member is actuated from a closed position to an opened position. During this process, the latch member rotates upwardly and rearwardly to provide a clearance for receiving the IC package. When the latch member is turned from the opened position to the closed position, it then rotates downwardly and forwardly to press the IC package so as to secure the IC package on the base.

However, due to the rigidity and non-deformability of the latch member, the thicknesses of the IC packages must keep constant, i.e. each socket is only intended for a certain type of IC package. Thus, when a loaded IC package is with a thickness different from previous one, the latch member must be adjusted accordingly to a new position by redesigned the base dimension that is with a high cost.

Therefore, there is a need to provide a new IC socket that overcomes the above-mentioned problems.

SUMMARY OF THE INVENTION

An object of the present invention is to provide an IC (Integrated Circuit) socket, and more particularly to provide an IC socket having an individual latch hinge which can be easily replaced with another one with suitable dimension.

To achieve the aforementioned object, an IC socket comprises a driving member capable of being operated between an upper position and a lower position, a socket body mounted below the driving member, and a latch member. The socket body has a base which is assembled with a detachable latch hinge. The latch member is pivotally assembled to the latch hinge and driven by the driving member to shift between a closed position and an opened position.

To further achieve the aforementioned object, an IC socket for receiving an IC package comprises a socket body for carrying the IC package, the socket body includes a base with an individual latch hinge. A plurality of contacts are received in the socket body for electrical connection with the IC package. A driving member is mounted upon the socket body and is able to operate between an upper position and a lower position. At least one latch member attaches to the latch hinge and driven by the driving member to open and close.

Other objects, advantages and novel features of the invention will become more apparent from the following detailed description of a preferred embodiment when taken in conjunction with the accompanying drawings.

DETAILED DESCRIPTION OF THE INVENTION

Figure 1:
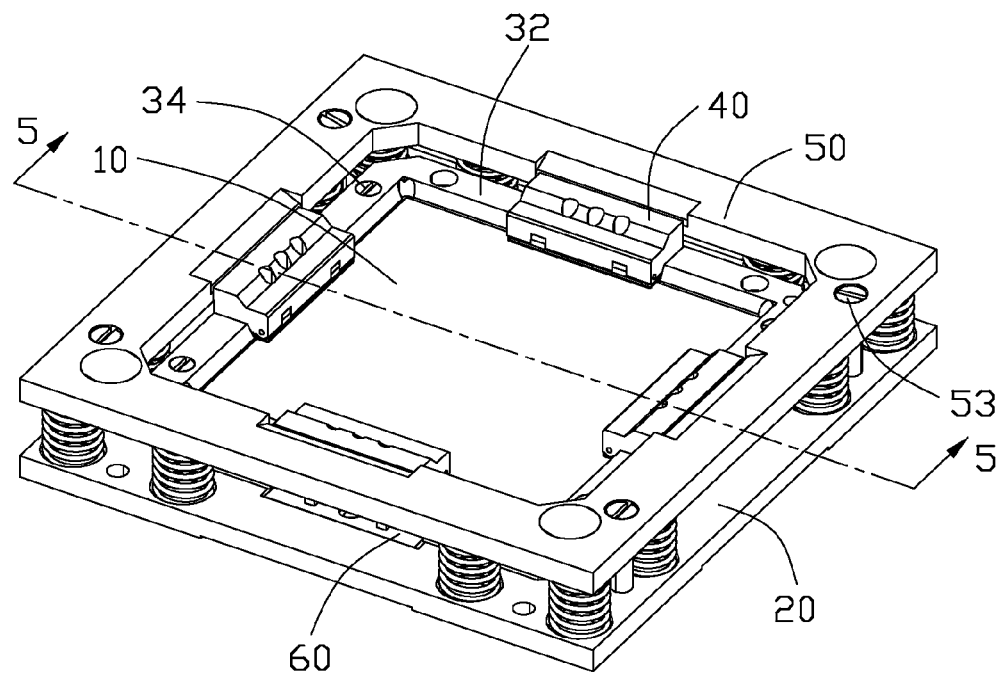
FIG. 1 is an assembled perspective view of an IC socket in accordance with the present invention.
Figure 2:
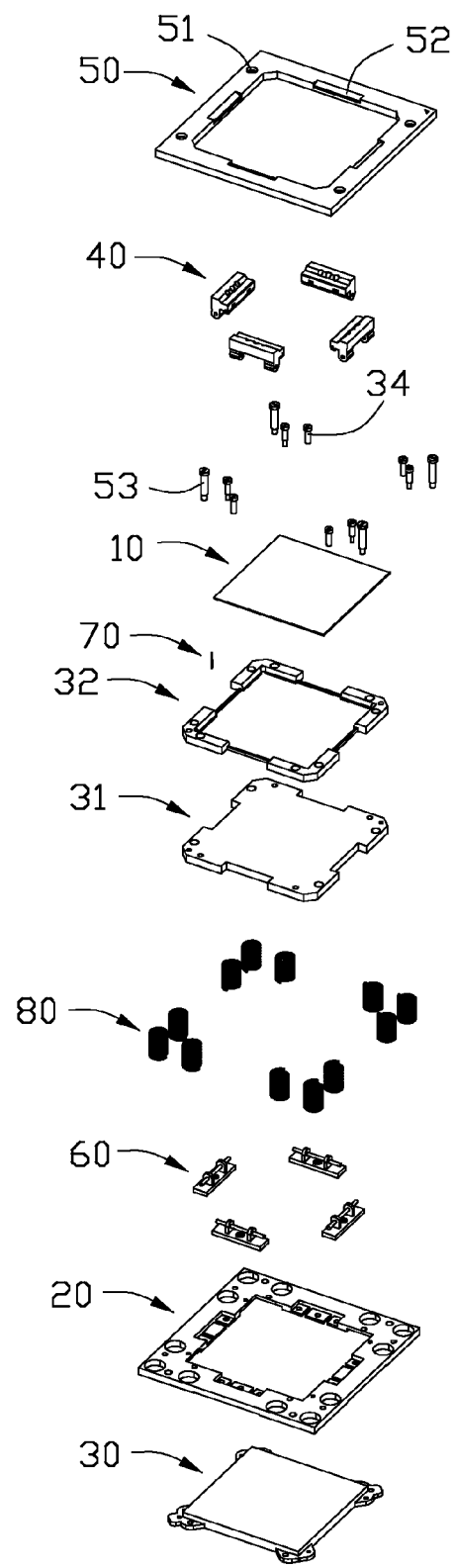
FIG. 2 is an exploded view of the IC socket shown in FIG. 1.

Referring to FIGS. 1-2, an Integrated Circuit (IC) socket made in accordance with a preferred embodiment of the present invention is used for testing an IC package 10 therein. The IC socket includes a socket body (not labeled) for receiving the IC package 10 therein, a plurality of contacts 70 received in the socket body for electrical interconnection with the IC package 10, four latch members 40 assembled on the socket body, and a driving member 50 mounted upon the socket body and operated between an upper position and a lower position to drive the four latch members 40.

The socket body includes a base 20, a bottom plate 30, a top plate 31, and an adapter 32 mounted to the base 20 by a number of bolts 34. The bottom plate 30 is fixed below the base 20 and retained in an opening 21 of the base 20, the top plate 31 and the adapter 32 are mounted upon the bottom plate 30 one by one. The bottom plate 30 and the top plate 31 retain a plurality of contacts 70 thereon and arranged in a matrix array. Top ends of the contacts 70 extend beyond the top plate 31 and partially retain in the adapter 32 which can move upwardly and downwardly and is used to protect the contacts 70 and lead solder balls of the IC package 10.

Figure 3:
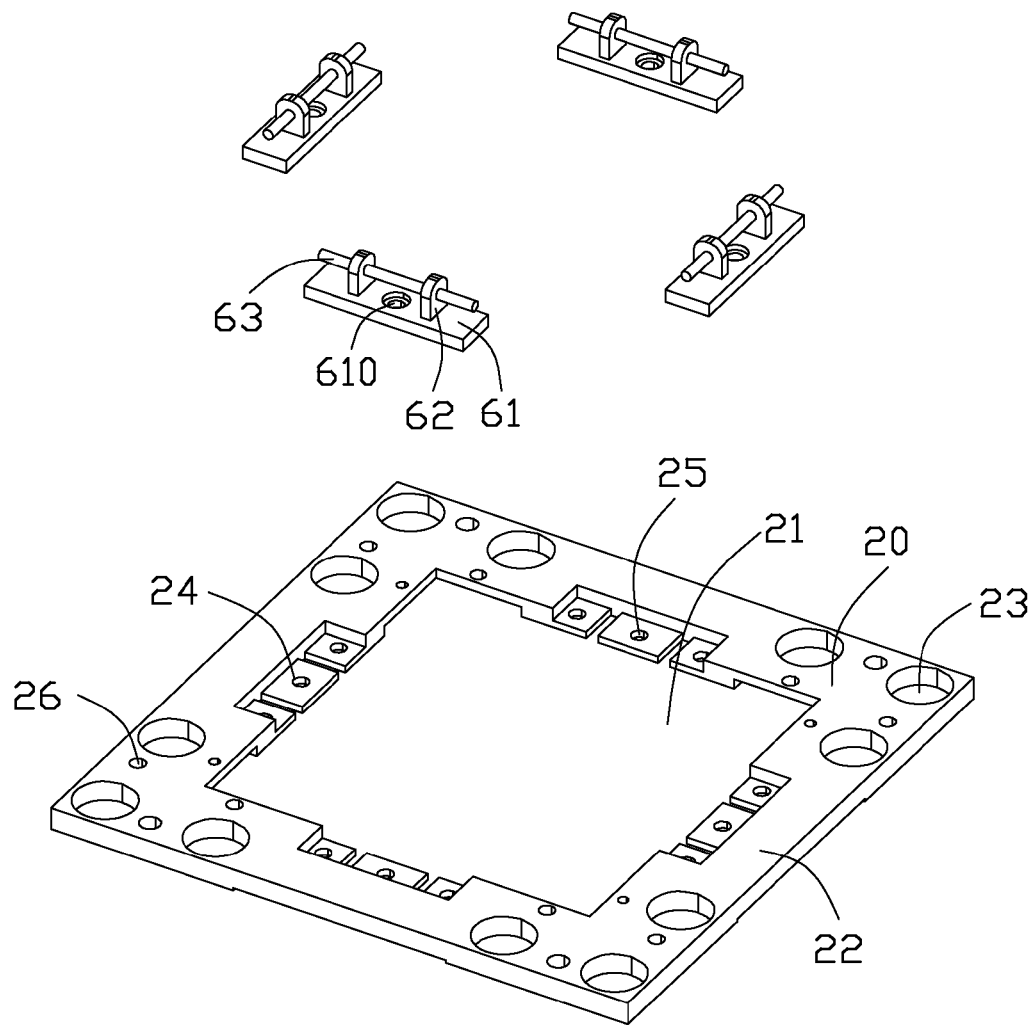
FIG. 3 is an exploded view of a latch hinge and a base of the IC socket shown in FIG. 2.
Figure 4:
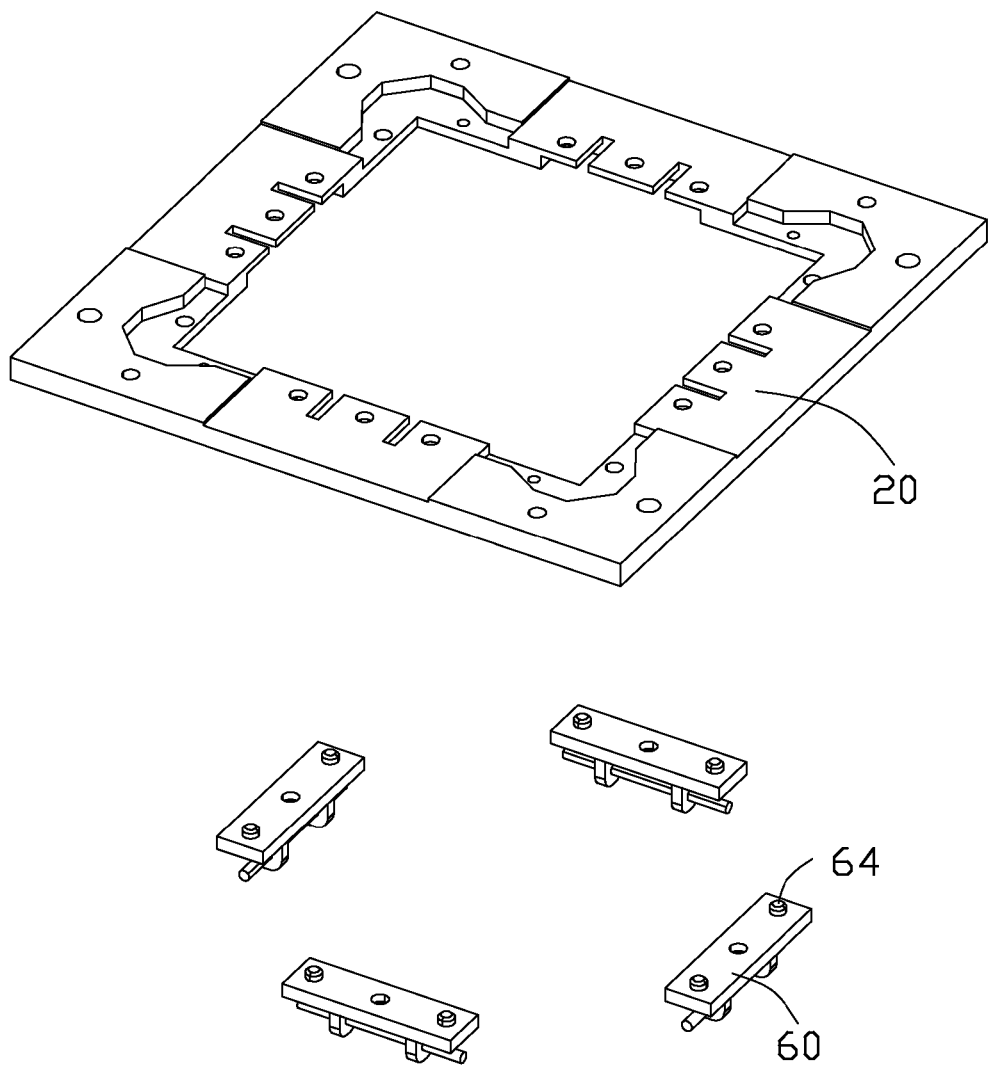
FIG. 4 is similar with FIG. 3, but taken from another side.

Referring to FIGS. 3-4, the base 20 is configured with four side edges 22 surrounding the opening 21. A plurality of receiving holes 23 are arranged in corners of the base 20 for receiving springs 80 therein, which provide reciprocal forces for the driving member 50. Four recesses 24 are defined in middles of the four side edges 22 to retain four individual latch hinges 60 which are used to retain the latch members 40.

Each latch hinge 60 comprises a fixing base 61 seated in the recesses 24 and a through hole 610 defined in the middle of the fixing base 61. A plurality of screws pass through the through holes 610 and corresponding holes 25 defined on the base 20 to secure the fixing base 61 and the base 20 together. Each latch hinge 60 further has a pair of pivotal portions 62 extending upwardly from the fixing base 61 and has a latch pin 63. The latch pin 63 extends beyond opposite sides of the pivotal portions 62 to pivotally mount with the latch member 40. In addition, the fixing base 61 has two alignment pins 64 on a bottom surface thereof to orientate the latch hinge 60 in accurate position of the base 20.

Referring to FIG. 2, the driving member 50 defines four mating holes 51 for receiving a plurality of screws 53. The screws 53 pass through the mating holes 51 and corresponding fixing holes 26 so as to secure the driving member 50 and the base 20. The driving member 50 is configured substantially in a rectangular frame with four urging portions 52 corresponding to rear surfaces 41 of the latch members 40 so as to drive the latch members 40 to open and close.

Figure 5:
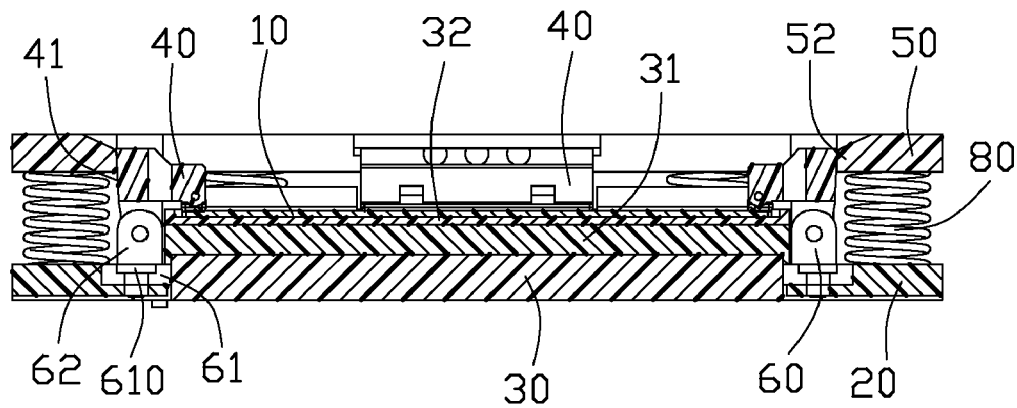
FIG. 5 is a cross-sectional view of the IC socket taken along line 5-5 in FIG. 1.

FIG. 5 is a cross-sectional view of the IC socket, showing the latch device 5 located at a final position and pressing the IC package 10. If the IC package 10 loaded into the socket body to be tested has a small thickness, a latch hinge 60 with a small height is assembled to the base 20, thus the latch member 40 can abut against the IC package 10. Similarly, when a thicker IC package 10 is loaded, another latch hinge 60 with a larger height is mounted to provide an adequate space for this IC package 10 to ensure the latch member 40 can rightly abut against the IC package 10.

In the present invention, the IC socket can test various IC packages in different thickness by merely selecting a proper latch hinges 60 according to corresponding IC package.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An IC socket comprising:
   a driving member capable of being operated between an upper position and a lower position;
   a socket body mounted below the driving member and having a base;
   a detachable latch hinge fixed on the base and being stationary relative to the base; and
   a latch member pivotally and mechanically mounted with and supported by the latch hinge so as to be actuated by the driving member to shift between a closed position and an opened position;
   wherein the latch hinge has a pair of alignment pins disposed at a bottom surface thereof for orientating the latch hinge in position relative to the base.

2. The IC socket as claimed in claim 1, wherein the socket body further includes a bottom plate mounted in the base, a top plate mounted upon the bottom plate, and an adapter mounted upon the top plate.

3. The IC socket as claimed in claim 2, wherein the adapter is moveable upwardly and downwardly relative to the socket body.

4. The IC socket as claimed in claim 2, wherein the base has a center opening to receive the bottom plate.

5. The IC socket as claimed in claim 4, wherein the base has four continuation side edges together defining the opening, and each side edge has a recess to retain the latch hinge.

6. The IC socket as claimed in claim 5, wherein the latch hinge comprises a fixing base seated within the recess, and a through hole defined in the fixing base for a screw to pass through to secure the latch hinge and the base together.

7. The IC socket as claimed in claim 6, wherein the latch hinge further has a pair of pivotal portions extending upwardly from the fixing base and a latch pin assembled to the pivotal portions on which the latch member is assembled.

8. The IC socket as claimed in claim 1, wherein the driving member is configured substantially in a rectangular frame with four urging portions corresponding to rear surfaces of the latch members so as to drive the latch members to open and close.

9. An IC socket for receiving an IC package comprising:
   a socket body for carrying the IC package, the socket body including a base with an individual latch hinge;
   a plurality of contacts received in the socket body for electrical connection with the IC package;
   a driving member mounted upon the socket body and being able to operate between an upper position and a lower position; and
   at least one latch member removeably attached to the latch hinge and driven by the driving member to open and close;
   wherein at least one aligning pin extends downwardly from a bottom of the latch hinge to accurately orientate the latch hinge on the base.

10. The IC socket as claimed in claim 9, wherein the latch hinge is assembled to the base by a screw passing through a through hole of the latch hinge.

11. The IC socket as claimed in claim 10, wherein the latch member is actuated by an urging portion of the driving member.

12. The IC socket as claimed in claim 9, wherein the socket body includes a bottom plate mounted in an opening of the base, a top plate mounted upon the bottom plate, an adapter mounted upon the top plate, and a plurality of bolts securing the base, the bottom plate, the top plate, and the adapter together.

13. The IC socket as claimed in claim 9, wherein the latch member presses the IC package at a closed position, the latch hinge can be replaced with another one to change a height of the latch member at the closed position.

14. An IC socket for mutually exclusive use with both thicker and thinner IC packages, comprising:
   a socket body including a frame-like base having a plurality of side plates commonly surrounding a center opening;
   a plurality of latch hinges removably and replaceably assembled to the corresponding side plates, respectively, each of said latch hinges defining a horizontal pivotal pin relative to the base;
   a plurality of latches pivotally mounted to the corresponding pins of the latch hinges, respectively; and
   a driving member moving upward and downward relative to the base to drive the corresponding latches to move pivotally, respectively;
   wherein a pair of alignment pins extends downwardly from a bottom of the each latch hinge to accurately orientate the latch hinge on the base.

* * * * *